(12) United States Patent
Khlat

(10) Patent No.: US 10,666,225 B2
(45) Date of Patent: May 26, 2020

(54) ACOUSTIC IMPEDANCE TRANSFORMATION CIRCUIT AND RELATED APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/387,940

(22) Filed: Apr. 18, 2019

(65) Prior Publication Data

US 2020/0099364 A1 Mar. 26, 2020

Related U.S. Application Data

(60) Provisional application No. 62/734,371, filed on Sep. 21, 2018.

(51) Int. Cl.
| | |
|---|---|
| *H03H 9/13* | (2006.01) |
| *H03H 9/205* | (2006.01) |
| *H03H 9/54* | (2006.01) |
| *H03F 3/19* | (2006.01) |

(52) U.S. Cl.
CPC .............. *H03H 9/545* (2013.01); *H03F 3/19* (2013.01); *H03H 9/13* (2013.01); *H03H 9/205* (2013.01); *H03F 2200/294* (2013.01); *H03F 2200/451* (2013.01)

(58) Field of Classification Search
CPC .......... H03H 9/545; H03H 9/13; H03H 9/205; H03F 3/19; H03F 2200/294; H03F 2200/451
See application file for complete search history.

(56) References Cited

U.S. PATENT DOCUMENTS

| | | | | |
|---|---|---|---|---|
| 6,246,153 B1* | 6/2001 | Bishop | .................. | B06B 1/0238 310/316.01 |
| 6,671,016 B1* | 12/2003 | Kim | .................. | G02F 1/133514 349/114 |
| 7,515,018 B2* | 4/2009 | Handtmann | ......... | H03H 9/0095 333/133 |
| 10,284,174 B2 | 5/2019 | Khlat et al. | | |

OTHER PUBLICATIONS

Karasawa, Rei, et al., "c-Axis zig-zag polarization inverted ScAlN multilayer for FBAR transformer rectifying antenna," IEEE International Ultrasonics Symposium, 2017, Washington, DC, 4 pages.

(Continued)

*Primary Examiner* — Dinh T Le
(74) *Attorney, Agent, or Firm* — Withrow & Terranova, P.L.L.C.

(57) ABSTRACT

An acoustic impedance transformation circuit and related apparatus are provided. In aspects discussed herein, the acoustic impedance transformation circuit can be configured to transform an input impedance into an output impedance higher than the input impedance. In this regard, the acoustic impedance transformation circuit can be provided in an apparatus to enable impedance matching between two electrical circuits. As a result, it may be possible to reduce signal reflection resulting from impedance mismatch between the two circuits, thus helping to improve performance of the apparatus.

20 Claims, 8 Drawing Sheets

(56) References Cited

OTHER PUBLICATIONS

Larson, John, et al., "Characterization of Reversed c-axis AlN Thin Films," IEEE International Ultrasonics Symposium, San Diego, California, 2010, pp. 1054-1059.
Sussman-Fort, Stephen, "Matching Network Design Using Non-Foster Impedances," Antenna Products and Technologies, EDO Electronic Systems Group, ieee.li/pdf/viewgraphs/matching_network_design_non_foster_impedances, accessed Sep. 10, 2019, Bohemia, New York, 43 pages.
U.S. Appl. No. 16/356,279, filed Mar. 18, 2019.
U.S. Appl. No. 16/358,913, filed Mar. 20, 2019.
U.S. Appl. No. 16/385,301, filed Apr. 16, 2019.

* cited by examiner

ACOUSTIC IMPEDANCE
TRANSFORMATION CIRCUIT AND
RELATED APPARATUS

RELATED APPLICATIONS

This application claims the benefit of U.S. provisional patent application Ser. No. 62/734,371, filed on Sep. 21, 2018, the disclosure of which is incorporated herein by reference in its entirety.

FIELD OF THE DISCLOSURE

The technology of the disclosure relates generally to impedance matching in an electronic apparatus.

BACKGROUND

Wireless devices have become increasingly common in current society. The prevalence of these wireless devices is driven in part by the many functions that are now enabled on such devices for supporting a variety of applications. In this regard, a wireless device may employ a variety of circuits and/or components (e.g., filters, transceivers, antennas, and so on) to support different numbers and/or types of applications. Accordingly, the wireless device may include a number of switches to enable dynamic and flexible couplings between the variety of circuits and/or components.

Acoustic resonators, such as surface acoustic wave (SAW) resonators and bulk acoustic wave (BAW) resonators, are used in many high-frequency communication applications. In particular, SAW resonators are often employed in filter networks that operate frequencies up to 1.8 GHz, and BAW resonators are often employed in filter networks that operate at frequencies above 1.5 GHz. Such filters need to have flat passbands, have steep filter skirts and squared shoulders at the upper and lower ends of the passband, and provide excellent rejection outside of the passband. SAW and BAW-based filters also have relatively low insertion loss, tend to decrease in size as the frequency of operation increases, and are relatively stable over wide temperature ranges.

As such, SAW and BAW-based filters are the filter of choice for many 3rd Generation (3G) and 4th Generation (4G) wireless devices and are destined to dominate filter applications for 5th Generation (5G) wireless devices. Most of these wireless devices support cellular, wireless fidelity (Wi-Fi), Bluetooth, and/or near field communications on the same wireless device and, as such, pose extremely challenging filtering demands. While these demands keep raising the complexity of wireless devices, there is a constant need to improve the performance of acoustic resonators and filters that are based thereon.

SUMMARY

Aspects disclosed in the detailed description include an acoustic impedance transformation circuit and related apparatus. In aspects discussed herein, the acoustic impedance transformation circuit can be configured to transform an input impedance into an output impedance higher than the input impedance. In this regard, the acoustic impedance transformation circuit can be provided in an apparatus to enable impedance matching between two electrical circuits. As a result, it may be possible to reduce signal reflection resulted from impedance mismatch between the two circuit, thus helping to improve performance of the apparatus.

In one aspect, an acoustic impedance transformation circuit is provided. The acoustic impedance transformation circuit includes a first electrode, a second electrode, and a third electrode provided between the first electrode and the second electrode. The acoustic impedance transformation circuit also includes a first piezo layer provided between the first electrode and the third electrode. The acoustic impedance transformation circuit also includes a second piezo layer provided between the second electrode and the third electrode. The acoustic impedance transformation circuit is configured to transform an input impedance between the third electrode and the second electrode into an output impedance higher than the input impedance between the first electrode and the second electrode.

In another aspect, an apparatus is provided. The apparatus includes a filter circuit corresponding to an input impedance between an output node and a ground. The apparatus also includes an acoustic impedance transformation circuit. The acoustic impedance transformation circuit includes a first electrode. The acoustic impedance transformation circuit also includes a second electrode coupled to the ground. The acoustic impedance transformation circuit also includes a third electrode provided between the first electrode and the second electrode and coupled to the output node of the filter circuit. The acoustic impedance transformation circuit also includes a first piezo layer provided between the first electrode and the third electrode. The acoustic impedance transformation circuit also includes a second piezo layer provided between the second electrode and the third electrode. The acoustic impedance transformation circuit is configured to transform the input impedance between the third electrode and the second electrode into an output impedance higher than the input impedance between the first electrode and the second electrode.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1A:
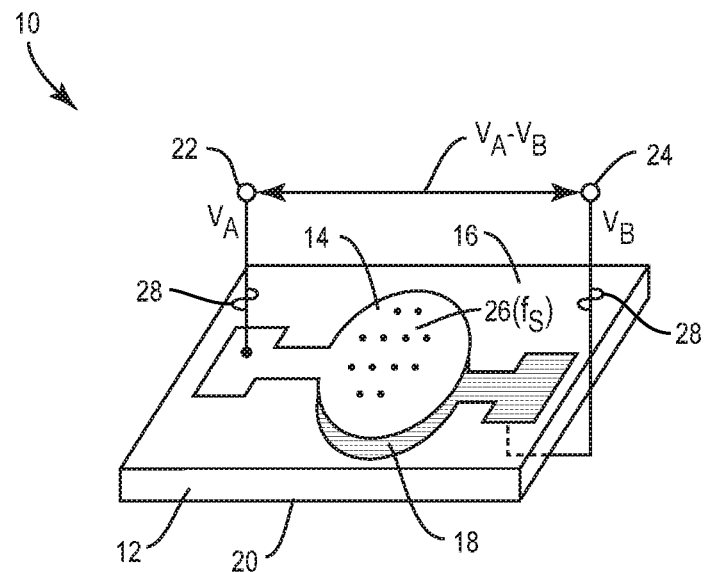
FIG. 1A is a schematic diagram of an exemplary bulk acoustic wave (BAW) resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an acoustic impedance transformation circuit and related apparatus. In aspects discussed herein, the acoustic impedance transformation circuit can be configured to transform an input impedance into an output impedance higher than the input impedance. In this regard, the acoustic impedance transformation circuit can be provided in an apparatus to enable impedance matching between two electrical circuits. As a result, it may be possible to reduce signal reflection resulted from impedance mismatch between the two circuit, thus helping to improve performance of the apparatus.

Figure 1B:
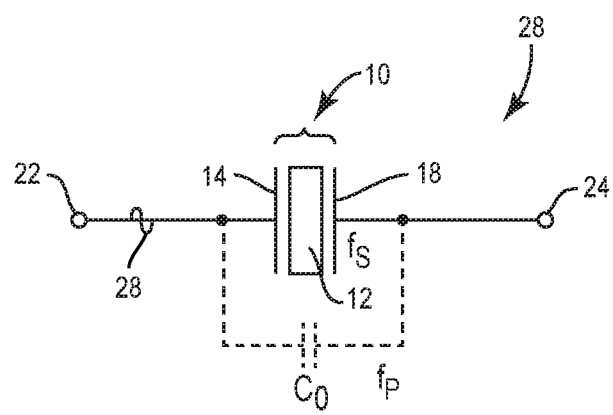
FIG. 1B is a schematic diagram providing an exemplary symbolic representation of the BAW resonator of FIG. 1A.

Before discussing an acoustic impedance transformation circuit of the present disclosure, a brief discussion of a bulk acoustic wave (BAW) acoustic resonator is first provided with reference to FIGS. 1A and 1B to help understand some key characteristics of an acoustic resonator. The discussion of specific exemplary aspects of the acoustic impedance transformation circuit of the present disclosure starts below with reference to FIG. 2.

In this regard, FIG. 1A is a schematic diagram of an exemplary acoustic resonator 10. The acoustic resonator 10 includes a piezo layer 12 (e.g., a quartz crystal), a first electrode 14 disposed on a top surface 16 of the piezo layer 12, and a second electrode 18 disposed on a bottom surface 20 of the piezo layer 12. When a first voltage $V_A$ and a second voltage $V_B$ are applied to a top electrical port 22 and a bottom electrical port 24, respectively, the acoustic resonator 10 resonates in a series resonance frequency ($f_S$) to cause an acoustic wave 26 between the top surface 16 and the bottom surface 20 of the piezo layer 12. As a result, the acoustic resonator 10 can pass a signal 28 from the top electrical port 22 to the bottom electrical port 24, thus making the acoustic resonator 10 to function as a signal filter in the series resonance frequency. Accordingly, the series resonance frequency ($f_S$) can also be referred to as a passband frequency of the signal filter. Notably, the series resonance frequency ($f_S$) may be determined by a thickness of the piezo layer 12 and/or a mass of the first electrode 14 and the second electrode 18.

FIG. 1B is a schematic diagram providing an exemplary symbolic representation of the acoustic resonator 10 of FIG. 1A. Common elements between FIGS. 1A and 1B are shown therein with common element numbers and will not be re-described herein.

For the acoustic resonator 10 to function properly as the signal filter, the acoustic resonator 10 is required to block the signal 28 in a parallel resonance frequency ($f_P$) that is different from the series resonance frequency ($f_S$). In this regard, the parallel resonance frequency ($f_P$) can also be referred to as a stopband frequency of the signal filter.

However, the first electrode 14 and the second electrode 18 in the acoustic resonator 10 may inherently cause an electrical capacitance $C_0$ in the parallel resonance frequency ($f_P$). The electrical capacitance $C_0$ can cause the acoustic resonator 10 to also resonate at a secondary frequency that falls within the parallel resonance frequency ($f_P$). Consequently, the acoustic resonator 10 may not be able to effectively block the signal 28 in all of the parallel resonance frequencies ($f_P$), thus compromising performance of the acoustic resonator 10. As such, it may be desired to eliminate the electrical capacitance $C_0$ caused by the acoustic resonator 10.

Figure 2:
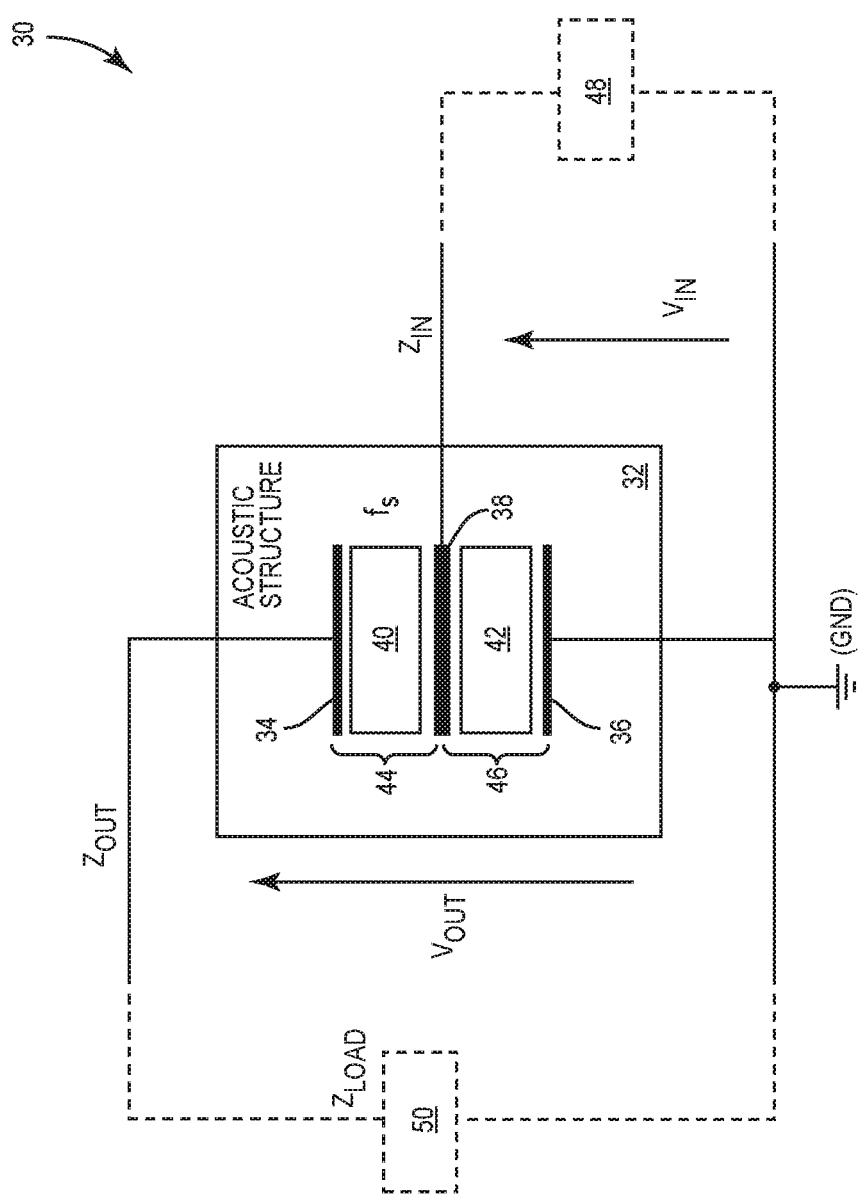
FIG. 2 is a schematic diagram of an exemplary acoustic impedance transformation circuit configured according to an embodiment of the present disclosure to transform an input impedance to an output impedance higher than the input impedance.

FIG. 2 is a schematic diagram of an exemplary acoustic impedance transformation circuit 30 configured according to an embodiment of the present disclosure to transform an input impedance ($Z_{IN}$) to an output impedance ($Z_{OUT}$) higher than the input impedance ($Z_{IN}$). The acoustic impedance transformation circuit 30 includes an acoustic structure 32. The acoustic structure 32 includes a first electrode 34, a second electrode 36, and a third electrode 38. The third electrode 38 is provided in between the first electrode 34 and the second electrode 36. The acoustic structure 32 includes a first piezo layer 40 provided between the first electrode 34 and the third electrode 38. The acoustic structure 32 also includes a second piezo layer 42 provided between the third electrode 38 and the second electrode 36. In a non-limiting example, the first piezo layer 40 and the second piezo layer 42 can be formed by quartz crystal. The thickness of the first piezo layer 40 and the second piezo layer 42 and/or the mass of the first electrode 34, the second electrode 36, and the third electrode 38 are factors that determine a series resonance frequency ($f_S$) of the acoustic structure 32.

The first electrode 34, the first piezo layer 40, and the third electrode 38 may be seen as collectively forming a first acoustic resonator 44. Likewise, the third electrode 38, the second piezo layer 42, and the second electrode 36 may be seen as collectively forming a second acoustic resonator 46. In this regard, the acoustic structure 32 may be seen as being formed by stacking the first acoustic resonator 44 with the second acoustic resonator 46.

In one non-limiting example, the first electrode 34, the first piezo layer 40, and the third electrode 38 can form a polarized-inverted acoustic resonator (also referred to as an f-type structure). In this regard, the first piezo layer 40 compresses when a positive voltage is applied between the first electrode 34 and the third electrode 38 and expands when a negative voltage is applied between the first electrode 34 and the third electrode 38. In contrast, the third electrode 38, the second piezo layer 42, and the second electrode 36 can form a polarized acoustic resonator (also referred to as an c-type structure). In this regard, the second piezo layer 40 expands when a positive voltage is applied between the second electrode 36 and the third electrode 38 and compresses when a negative voltage is applied between the second electrode 36 and the third electrode 38.

The second electrode 36 may be coupled to a ground (GND). As such, when an input voltage $V_{IN}$ is applied between the third electrode 38 and the second electrode 36, the acoustic structure 32 generates an output voltage $V_{OUT}$ between the first electrode 34 and the second electrode 36.

In a non-limiting example, the output voltage $V_{OUT}$ can be expressed in equation (Eq. 1) below.

$$V_{OUT} = N * V_{IN} \tag{Eq. 1}$$

In the equation (Eq. 1) above, N represents a count of the first acoustic resonator 44 and the second acoustic resonator 46. In the examples shown herein, the count of the first acoustic resonator 44 and the second acoustic resonator 46 in the acoustic structure 32 equals two (2) (N=2). Accordingly, the acoustic structure 32 can generate the output voltage ($V_{OUT}$) that equals two times the input voltage ($V_{IN}$) ($V_{OUT} = 2 * V_{IN}$).

As will be further discussed in FIGS. 5-8, the acoustic impedance transformation circuit 30 may be provided between a first circuit 48, such as a filter circuit, and a second circuit 50, such as a low-noise amplifier (LNA), to enable impedance matching between the first circuit 48 and the second circuit 50. In a non-limiting example, the acoustic structure 32 may be coupled to the first circuit 48 that presents the input impedance ($Z_{IN}$) (e.g., 25Ω) between the third electrode 38 and the second electrode 36. The acoustic structure 32 may be coupled to the second circuit 50 configured to operate based on an optimal load impedance ($Z_{LOAD}$) (e.g., 100Ω). Notably, the input impedance ($Z_{IN}$) presented by the first circuit 48 does not match the optimal load impedance ($Z_{LOAD}$) expected by the second circuit 50. Consequently, a signal reflection may occur between the first circuit 48 and the second circuit 50, thus compromising performance of the first circuit 48 and/or the second circuit 50.

In this regard, the acoustic structure 32 is configured to transform the input impedance ($Z_{IN}$) presented by the first circuit 48 to the output impedance ($Z_{OUT}$) between the first electrode 34 and the second electrode 36 to match the optimal load impedance ($Z_{LOAD}$) expected by the second circuit 50. By transforming the impedance ($Z_{IN}$) into the output impedance ($Z_{OUT}$) to match the optimal load impedance ($Z_{LOAD}$), it may be possible to reduce signal reflection between the first circuit 48 and the second circuit 50, thus helping to improve the performance of the first circuit 48 and/or the second circuit 50. In a non-limiting example, the output impedance ($Z_{OUT}$) can be expressed in equation (Eq. 2) below.

$$Z_{OUT} = N^2 * Z_{IN} \tag{Eq. 2}$$

In the equation (Eq. 2) above, N represents the count of the first acoustic resonator 44 and the second acoustic resonator 46. In the examples shown herein, the count of the first acoustic resonator 44 and the second acoustic resonator 46 in the acoustic structure 32 equals 2 (N=2). Accordingly, the acoustic structure 32 can transform the input impedance ($Z_{IN}$) into the output impedance ($Z_{OUT}$) that equals four (4) times the input impedance ($Z_{IN}$) ($Z_{OUT} = 4 * Z_{IN}$). Thus, when the first circuit 48 presents the input impedance ($Z_{IN}$) at 25Ω, the acoustic impedance transformation circuit 30 is able to transform the input impedance ($Z_{IN}$) into the output impedance ($Z_{OUT}$) at 100Ω, thus matching the optimal load impedance ($Z_{LOAD}$) expected by the second circuit 50.

Figure 3:
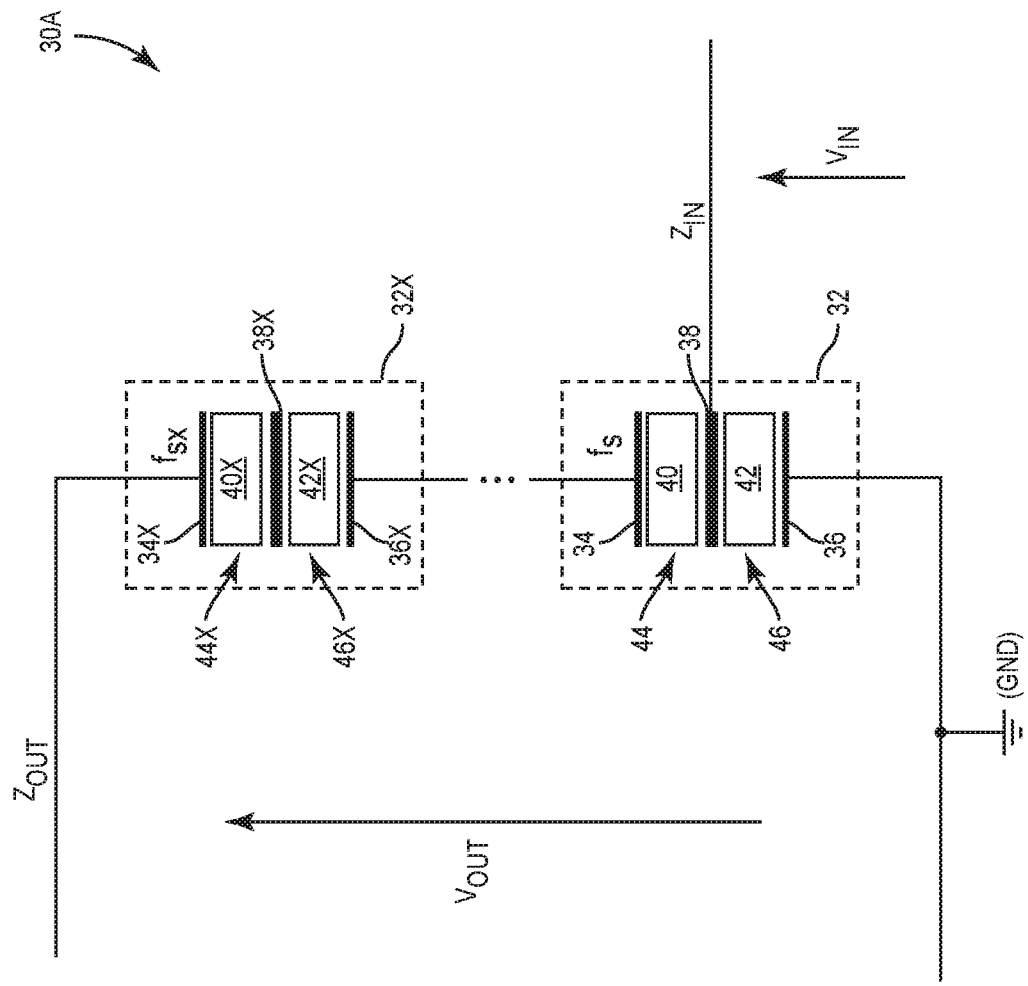
FIG. 3 is a schematic diagram of an exemplary acoustic impedance transformation circuit configured according to another embodiment of the present disclosure to transform an input impedance to an output impedance higher than the input impedance.

FIG. 3 is a schematic diagram of an exemplary acoustic impedance transformation circuit 30A configured according to another embodiment of the present disclosure to transform an input impedance ($Z_{IN}$) to an output impedance ($Z_{OUT}$) higher than the input impedance ($Z_{IN}$). Common elements between FIGS. 2 and 3 are shown therein with common element numbers and will not be re-described herein.

The acoustic impedance transformation circuit 30A includes at least one second acoustic structure 32X coupled in series to the acoustic structure 32. Specifically, the second acoustic structure 32X includes at least one first electrode 34X, at least one second electrode 36X, and at least one third electrode 38X provided between the first electrode 34X and the second electrode 36X. The second acoustic structure 32X includes at least one first piezo layer 40X provided between the first electrode 34X and the third electrode 38X and at least one second piezo layer 42X provided between the third electrode 38X and the second electrode 36X. The second electrode 36X of the second acoustic structure 32X is coupled to the first electrode 34 of the acoustic structure 32. The first electrode 34X, the first piezo layer 40X, and the third electrode 38X collectively form a third acoustic resonator 44X (e.g., a polarized-inverted acoustic resonator). The second electrode 36X, the second piezo layer 42X, and the third electrode 38X collectively form a fourth acoustic resonator 46X (e.g., a polarized acoustic resonator).

The acoustic impedance transformation circuit 30A is configured to receive the input impedance ($Z_{IN}$) between the third electrode 38 and the second electrode 36 of the acoustic structure 32. The acoustic impedance transformation circuit 30A is configured to transform the input impedance ($Z_{IN}$) into the output impedance ($Z_{OUT}$) between the first electrode 34X of the second acoustic structure 32X and the second electrode 36 of the acoustic structure 32. The output impedance ($Z_{OUT}$) is related to the input impedance ($Z_{IN}$) in accordance to the equation (Eq. 2) above.

In the example discussed herein, the count of the first acoustic resonator 44, the second acoustic resonator 46, the third acoustic resonator 44X, and the fourth acoustic resonator 46X in the acoustic impedance transformation circuit 30A equals 4 (N=4). Accordingly, the acoustic structure 32A can transform the input impedance ($Z_{IN}$) into the output impedance ($Z_{OUT}$) that equals at least sixteen (16) times the input impedance ($Z_{IN}$) ($Z_{OUT} \geq 16*Z_{IN}$).

Figure 4:
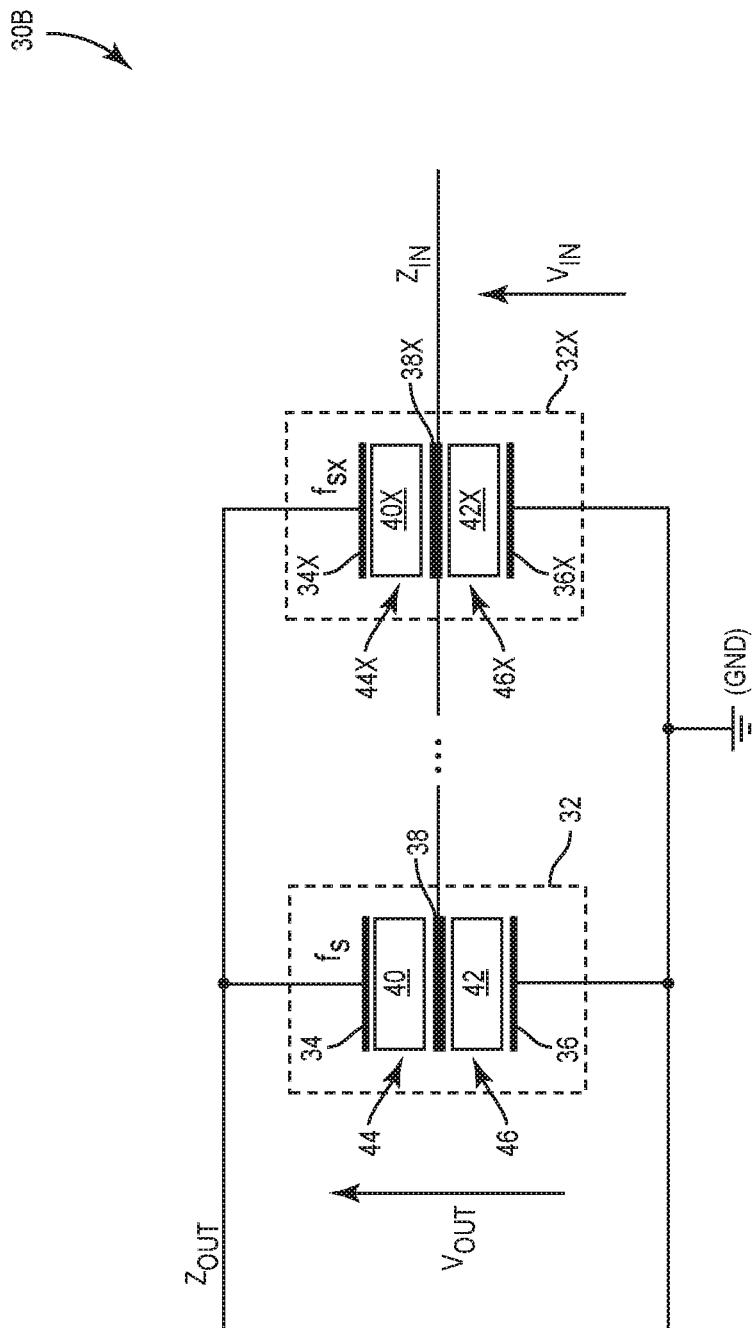
FIG. 4 is a schematic diagram of an exemplary acoustic impedance transformation circuit configured according to another embodiment of the present disclosure to transform an input impedance to an output impedance higher than the input impedance.

FIG. 4 is a schematic diagram of an exemplary acoustic impedance transformation circuit 30B configured according to another embodiment of the present disclosure to transform an input impedance ($Z_{IN}$) to an output impedance ($Z_{OUT}$) higher than the input impedance ($Z_{IN}$). Common elements between FIGS. 2 and 4 are shown therein with common element numbers and will not be re-described herein.

The acoustic impedance transformation circuit 30B includes at least one second acoustic structure 32X coupled in parallel to the acoustic structure 32. Specifically, the second acoustic structure 32X includes at least one first electrode 34X, at least one second electrode 36X, and at least one third electrode 38X provided between the first electrode 34X and the second electrode 36X. The second acoustic structure 32X includes at least one first piezo layer 40X provided between the first electrode 34X and the third electrode 38X and at least one second piezo layer 42X provided between the third electrode 38X and the second electrode 36X.

The first electrode 34X of the second acoustic structure 32X is coupled to the first electrode 34 of the acoustic structure 32. The second electrode 36X of the second acoustic structure 32X is coupled to the second electrode 36 of the acoustic structure 32. The third electrode 38X of the second acoustic structure 32X is coupled to the third electrode 38 of the acoustic structure 32. The first electrode 34X, the first piezo layer 40X, and the third electrode 38X collectively form a third acoustic resonator 44X (e.g., a polarized-inverted acoustic resonator). The second electrode 36X, the second piezo layer 42X, and the third electrode 38X collectively form a fourth acoustic resonator 46X (e.g., a polarized acoustic resonator). By providing the second acoustic structure 32X, the acoustic impedance transformation circuit 30B may be able to transform the input impedance ($Z_{IN}$) into the output impedance ($Z_{OUT}$) in at least one second series resonance frequency ($f_{SX}$).

In the examples shown herein, the count of the first acoustic resonator 44 and the second acoustic resonator 46 in the acoustic structure 32 equals 2 (N=2). Accordingly, the acoustic structure 32 can transform the input impedance ($Z_{IN}$) into the output impedance ($Z_{OUT}$) that equals four (4) times the input impedance ($Z_{IN}$) ($Z_{OUT}=4*Z_{IN}$).

Figure 5:
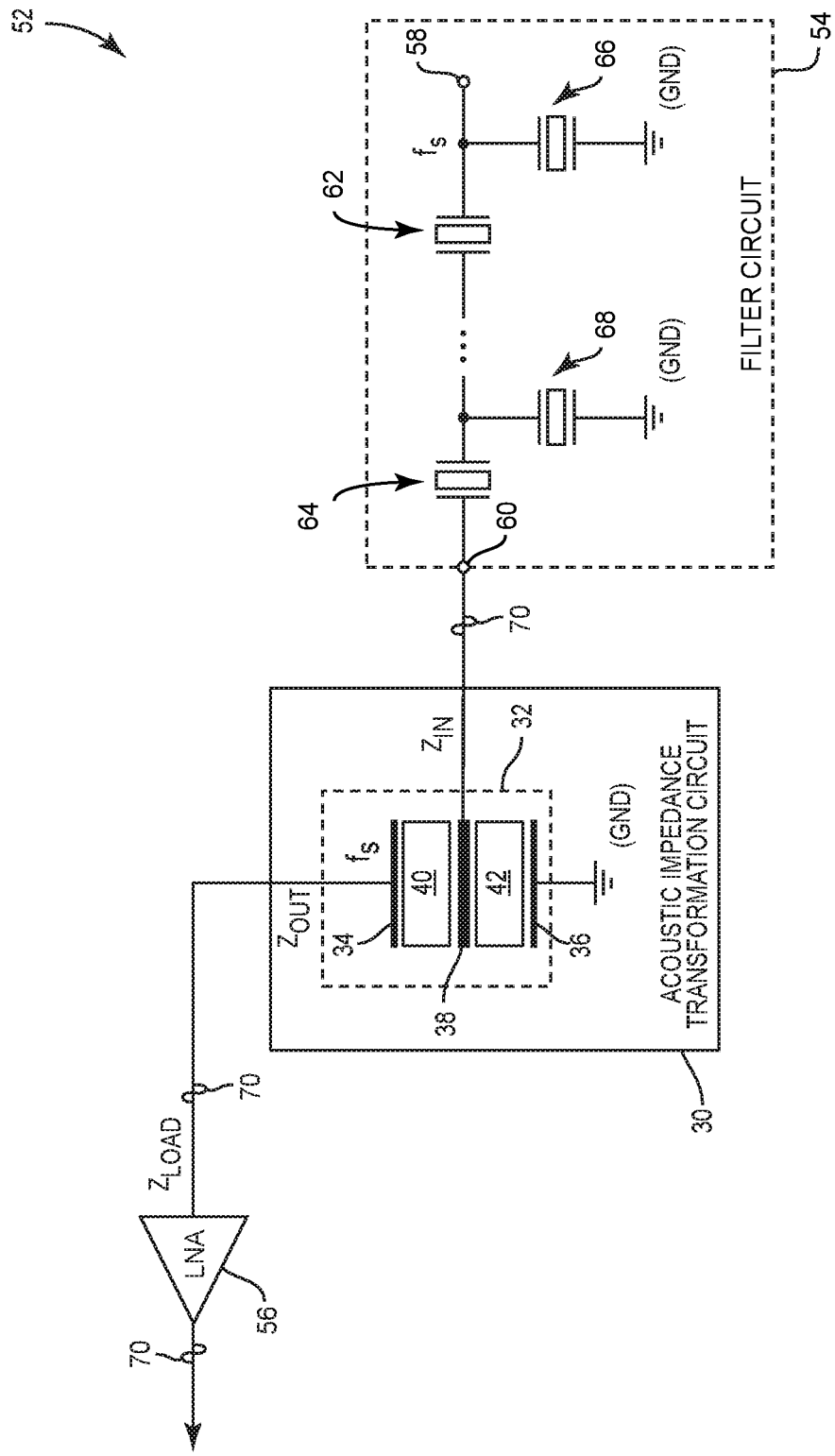
FIG. 5 is a schematic diagram of an exemplary apparatus incorporating the acoustic impedance transformation circuit of FIG. 2 for enabling impedance matching between two coupled circuits.

The acoustic impedance transformation circuit 30 of FIG. 2 can be provided in an apparatus to perform impedance transformation between two related circuits. In this regard, FIG. 5 is a schematic diagram of an exemplary apparatus 52 incorporating the acoustic impedance transformation circuit 30 of FIG. 2 for enabling impedance matching between a first circuit 54 and a second circuit 56. Common elements between FIGS. 2 and 5 are shown therein with common element numbers and will not be re-described herein.

In a non-limiting example, the first circuit 54 is a filter circuit (e.g., an acoustic ladder network) coupled between an input node 58 and an output node 60. The output node 60 is coupled to the third electrode 38 of the acoustic structure 32. The second circuit 56 may be an LNA that is coupled to the first electrode 34 of the acoustic structure 32.

The first circuit 54 may include an input series acoustic resonator 62 coupled to the input node 58 and an output series acoustic resonator 64 coupled to the output node 60. The first circuit 54 may include a number of intermediate series acoustic resonators (not shown) between the input series acoustic resonator 62 and the output series acoustic resonator 64. The first circuit 54 may include an input shunt acoustic resonator 66 coupled between the input series acoustic resonator 62 and the ground (GND). The first circuit 54 may include an output shunt acoustic resonator 68 coupled between the output series acoustic resonator 64 and the ground (GND). The first circuit 54 may be configured to resonate in a series resonance frequency ($f_S$) to pass a signal 70 from the input node 58 to the output node 60.

The first circuit 54 inherently presents the input impedance ($Z_{IN}$) between the third electrode 38 and the second electrode 36 of the acoustic structure 32. The second circuit 56, on the other hand, is configured to operate at the optimal impedance ($Z_{LOAD}$) that does not match the input impedance ($Z_{IN}$) presented by the first circuit 54. In this regard, as discussed earlier in FIG. 2, the acoustic impedance transformation circuit 30 is configured to transform the input impedance ($Z_{IN}$) into the output impedance ($Z_{OUT}$) that matches the optimal load impedance ($Z_{LOAD}$). In a non-limiting example, the acoustic structure 32 is configured to resonate in the series resonance frequency ($f_S$) to pass the signal 70 to the second circuit 56.

Figure 6:
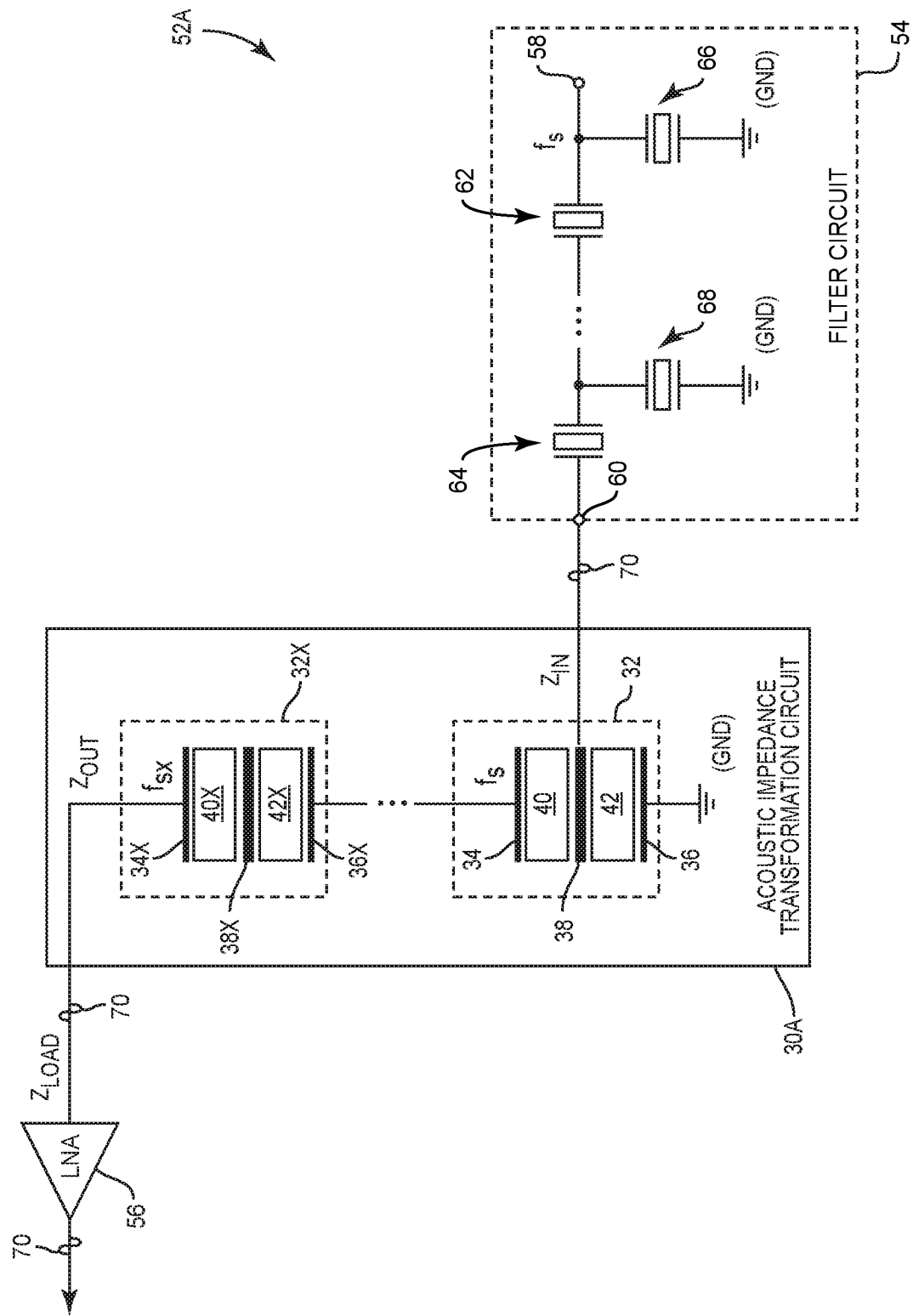
FIG. 6 is a schematic diagram of an exemplary apparatus incorporating the acoustic impedance transformation circuit of FIG. 3 for enabling impedance matching between two coupled circuits.

FIG. 6 is a schematic diagram of an exemplary apparatus 52A incorporating the acoustic impedance transformation circuit 30A of FIG. 3 for enabling impedance matching between the first circuit 54 and the second circuit 56. Common elements between FIGS. 3, 5, and 6 are shown therein with common element numbers and will not be re-described herein.

In a non-limiting example, the output node 60 is coupled to the third electrode 38 of the acoustic structure 32 and the second circuit 56 is coupled to the first electrode 34X of the second acoustic structure 32X. The first circuit 54 inherently presents the input impedance ($Z_{IN}$) between the third electrode 38 and the second electrode 36 of the acoustic structure 32. The second circuit 56, on the other hand, is configured to operate at the optimal impedance ($Z_{LOAD}$) that does not match the input impedance ($Z_{IN}$) presented by the first circuit 54. In this regard, as discussed earlier in FIG. 3, the acoustic impedance transformation circuit 30A is configured to transform the input impedance ($Z_{IN}$) into the output impedance ($Z_{OUT}$) that matches the optimal load impedance ($Z_{LOAD}$). In a non-limiting example, the acoustic structure 32 and the second acoustic structure 32X are configured to resonate in the series resonance frequency ($f_S$) to pass the signal 70 to the second circuit 56.

Figure 7:
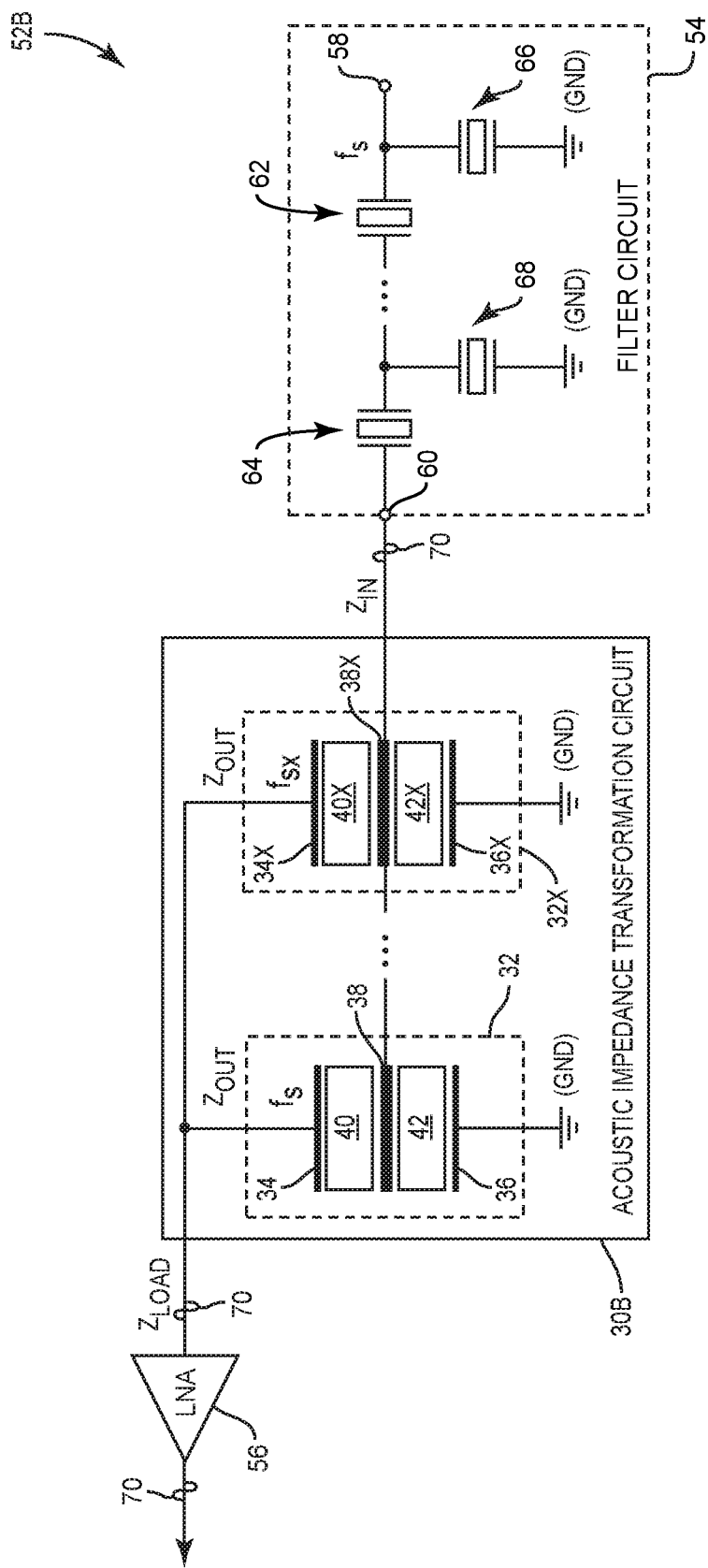
FIG. 7 is a schematic diagram of an exemplary apparatus incorporating the acoustic impedance transformation circuit of FIG. 4 for enabling impedance matching between two coupled circuits.

FIG. 7 is a schematic diagram of an exemplary apparatus 52B incorporating the acoustic impedance transformation circuit 30B of FIG. 4 for enabling impedance matching between the first circuit 54 and the second circuit 56. Common elements between FIGS. 4, 5, and 7 are shown therein with common element numbers and will not be re-described herein.

In a non-limiting example, the output node 60 is coupled to the third electrode 38 of the acoustic structure 32 and the third electrode 38X of the second acoustic structure 32X. The second circuit 56 is coupled to the first electrode 34 of the acoustic structure 32 and the first electrode 34X of the second acoustic structure 32X. The first circuit 54 inherently presents the input impedance ($Z_{IN}$) between the third electrode 38 and the second electrode 36 of the acoustic structure 32. The second circuit 56, on the other hand, is configured to operate at the optimal impedance ($Z_{LOAD}$) that does not match the input impedance ($Z_{IN}$) presented by the first circuit 54. In this regard, as discussed earlier in FIG. 4, the acoustic impedance transformation circuit 30A is configured to transform the input impedance ($Z_{IN}$) into the output impedance ($Z_{OUT}$) that matches the optimal load impedance ($Z_{LOAD}$). In a non-limiting example, the acoustic structure 32 and the second acoustic structure 32X can be configured to resonate in the series resonance frequency ($f_S$) and the second series resonance frequency ($f_{SX}$), respectively, to pass the signal 70 to the second circuit 56.

Figure 8:
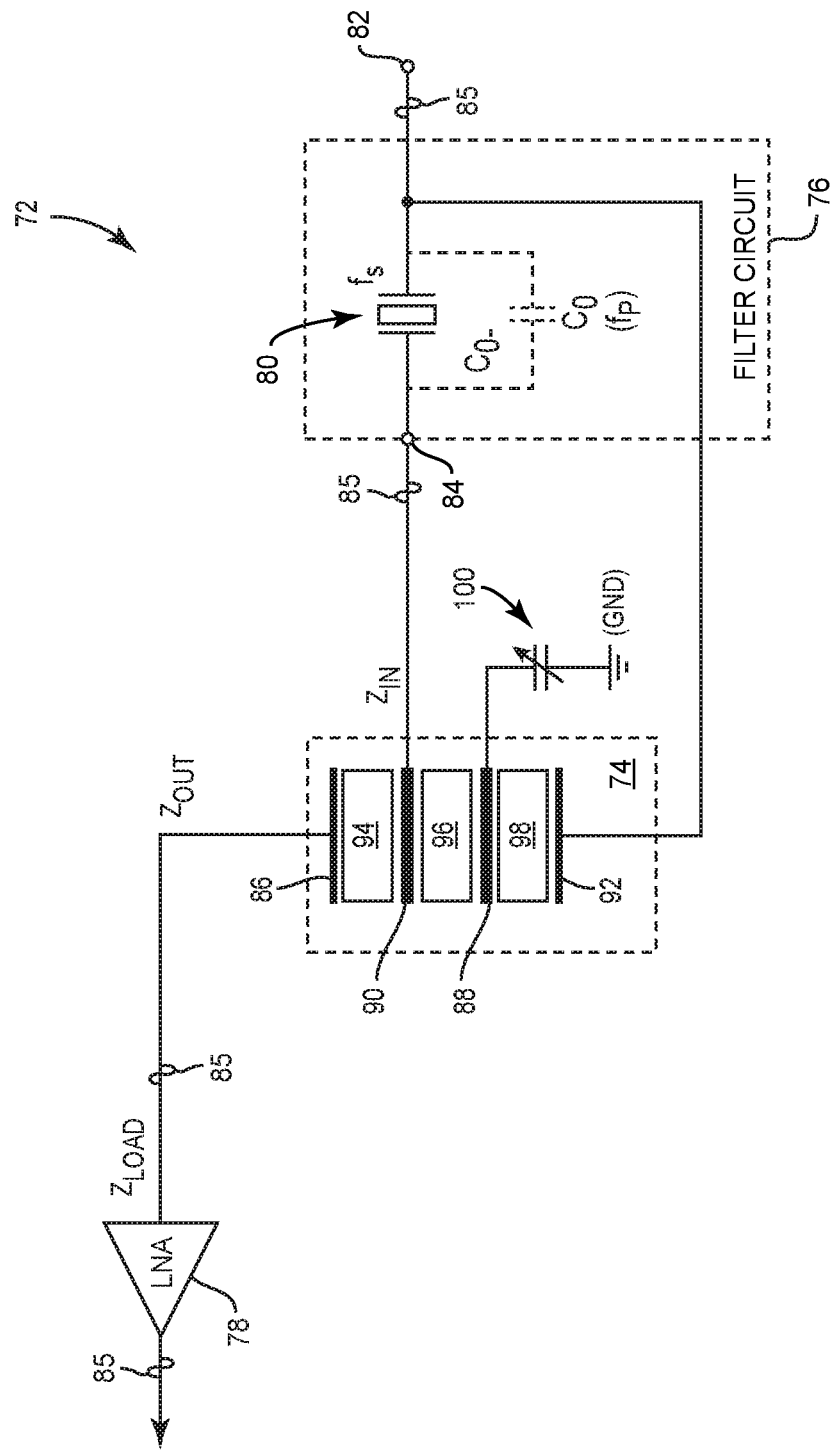
FIG. 8 is a schematic diagram of an exemplary apparatus including an acoustic impedance transformation circuit configured to cancel an electrical capacitance in addition to transforming an input impedance into an output impedance higher than the input impedance.

According to the earlier discussion of FIG. 1B, an acoustic resonator can cause an electrical capacitance $C_0$ in a parallel resonance frequency ($f_P$), which may compromise performance of the acoustic resonator. As such, it may be desired to configure the acoustic impedance transformation circuit 30 of FIG. 2 to cancel the electrical capacitance $C_0$ in addition to providing impedance transformation. In this regard, FIG. 8 is a schematic diagram of an exemplary apparatus 72 including an acoustic impedance transformation circuit 74 configured to cancel an electrical capacitance $C_0$ in addition to transforming an input impedance ($Z_{IN}$) into an output impedance ($Z_{OUT}$) higher than the input impedance ($Z_{IN}$).

The acoustic impedance transformation circuit 74 is coupled between a filter circuit 76 and an LNA 78. The filter circuit 76 includes at least one series acoustic resonator 80, such as the output series acoustic resonator 64 in FIGS. 5-7. The series acoustic resonator 80 is coupled between an input node 82 and an output node 84. The series acoustic resonator 80 is configured to resonate in a series resonance frequency ($f_S$) to pass a signal 85 from the input node 82 to the output node 84. Like the acoustic resonator 10 in FIG. 1B, the series acoustic resonator 80 may also cause an electrical capacitance $C_0$ in a parallel resonance frequency ($f_P$) that is different from the series resonance frequency ($f_S$).

The acoustic impedance transformation circuit 74 includes a first electrode 86, a second electrode 88, a third electrode 90, and a fourth electrode 92. The acoustic impedance transformation circuit 74 includes a first piezo layer 94 provided between the first electrode 86 and the third electrode 90, a second piezo layer 96 provided between the third electrode 90 and the second electrode 88, and a third piezo layer 98 provided between the second electrode 88 and fourth electrode 92.

The first electrode 86 is coupled to the LNA 78. The third electrode 90 is coupled to the output node 84 of the filter circuit 76. The fourth electrode 92 is coupled in between the input node 82 and the series acoustic resonator 80. The second electrode 88 is coupled to a ground (GND) via a tunable reactive circuit 100, which can be a tunable capacitor for example.

Like the first circuit 54 in FIGS. 5-7, the filter circuit 76 inherently presents an input impedance ($Z_{IN}$) between the third electrode 90 and the second electrode 88. Also, like the second circuit 56 in FIGS. 5-7, the LNA 78 is configured to operate based on an optimal load impedance ($Z_{LOAD}$) that is different from the input impedance ($Z_{IN}$). Thus, according to previous discussions in FIGS. 2 and 5, the acoustic impedance transformation circuit 74 can be configured to transform the input impedance ($Z_{IN}$) into an output impedance ($Z_{OUT}$) that matches the optimal load impedance ($Z_{LOAD}$).

In addition, the acoustic impedance transformation circuit 74 may be configured to generate a negative capacitance ($C_{0-}$) across the series acoustic resonator 80. The negative capacitance ($C_{0-}$) may be so generated to substantially equal the electrical capacitance ($C_0$) to cause the electrical capacitance ($C_0$) to be substantially canceled. For more information related using an acoustic structure to generate the negative capacitance ($C_{0-}$) to cancel the electrical capacitance ($C_0$), please refer to U.S. patent application Ser. No. 16/358,913, entitled "ACOUSTIC RESONATOR STRUCTURE," filed on Mar. 20, 2019.

Those skilled in the art will recognize improvements and modifications to the embodiments of the present disclosure. All such improvements and modifications are considered within the scope of the concepts disclosed herein and the claims that follow.

What is claimed is:

1. An acoustic impedance transformation circuit comprising:
   a first electrode, a second electrode, and a third electrode provided between the first electrode and the second electrode;
   a first piezo layer provided between the first electrode and the third electrode; and
   a second piezo layer provided between the second electrode and the third electrode;
   wherein:
       the first electrode, the first piezo layer, and the third electrode collectively form a polarized-inverted acoustic resonator;
       the third electrode, the second piezo layer, and the second electrode collectively form a polarized acoustic resonator; and
       the polarized-inverted acoustic resonator and the polarized acoustic resonator are configured to transform an input impedance between the third electrode and the second electrode into an output impedance higher than the input impedance between the first electrode and the second electrode.

2. The acoustic impedance transformation circuit of claim 1 wherein the second electrode is coupled to a ground.

3. The acoustic impedance transformation circuit of claim 1 configured to transform the input impedance into the output impedance that equals four times the input impedance.

4. The acoustic impedance transformation circuit of claim 1 further comprises an acoustic structure comprising:
 a first acoustic resonator comprising the first electrode, the first piezo layer, and the third electrode; and
 a second acoustic resonator comprising the third electrode, the second piezo layer, and the second electrode.

5. The acoustic impedance transformation circuit of claim 4 further comprising at least one second acoustic structure coupled in series to the acoustic structure and comprising:
 at least one first electrode, at least one second electrode coupled to the first electrode of the acoustic structure, and at least one third electrode provided between the at least one first electrode and the at least one second electrode;
 at least one first piezo layer provided between the at least one first electrode and the at least one third electrode; and
 at least one second piezo layer provided between the at least one second electrode and the at least one third electrode;
 wherein the acoustic impedance transformation circuit is further configured to transform the input impedance between the third electrode and the second electrode into the output impedance higher than the input impedance between the at least one first electrode and the second electrode of the acoustic structure.

6. The acoustic impedance transformation circuit of claim 5 wherein the output impedance equals at least sixteen times the input impedance.

7. The acoustic impedance transformation circuit of claim 4 further comprising at least one second acoustic structure comprising:
 at least one first electrode coupled to the first electrode;
 at least one second electrode coupled to the second electrode;
 at least one third electrode provided between the at least one first electrode and the at least one second electrode and coupled to the third electrode;
 at least one first piezo layer provided between the at least one first electrode and the at least one third electrode; and
 at least one second piezo layer provided between the at least one second electrode and the at least one third electrode.

8. The acoustic impedance transformation circuit of claim 7 configured to transform the input impedance into the output impedance that equals four times the input impedance.

9. An apparatus comprising:
 a filter circuit presenting an input impedance between an output node and a ground; and
 an acoustic impedance transformation circuit comprising:
  a first electrode;
  a second electrode coupled to the ground;
  a third electrode provided between the first electrode and the second electrode and coupled to the output node of the filter circuit;
  a first piezo layer provided between the first electrode and the third electrode; and
  a second piezo layer provided between the second electrode and the third electrode;
 wherein:
  the first electrode, the first piezo layer, and the third electrode collectively form a polarized-inverted acoustic resonator;
  the third electrode, the second piezo layer, and the second electrode collectively form a polarized acoustic resonator; and
  the polarized-inverted acoustic resonator and the polarized acoustic resonator are configured to transform the input impedance between the third electrode and the second electrode into an output impedance higher than the input impedance between the first electrode and the second electrode.

10. The apparatus of claim 9 wherein the acoustic impedance transformation circuit is further configured to transform the input impedance into the output impedance that equals four times the input impedance.

11. The apparatus of claim 9 wherein the filter circuit comprises an acoustic ladder network configured to resonate in a series resonance frequency to pass a signal from an input node to the output node.

12. The apparatus of claim 11 wherein:
 the first electrode of the acoustic impedance transformation circuit is coupled to a low-noise amplifier (LNA) configured to operate based on an optimal load impedance; and
 the acoustic impedance transformation circuit is further configured to transform the input impedance into the output impedance to match the optimal load impedance.

13. The apparatus of claim 12 wherein the acoustic impedance transformation circuit further comprises an acoustic structure comprising:
 a first acoustic resonator comprising the first electrode, the first piezo layer, and the third electrode; and
 a second acoustic resonator comprising the third electrode, the second piezo layer, and the second electrode.

14. The apparatus of claim 13 wherein the acoustic structure is configured to resonate in the series resonance frequency to pass the signal to the LNA.

15. The apparatus of claim 13 wherein the acoustic impedance transformation circuit further comprises at least one second acoustic structure coupled in series to the acoustic structure and comprising:
 at least one first electrode coupled to the LNA;
 at least one second electrode coupled to the first electrode of the acoustic structure;
 at least one third electrode provided between the at least one first electrode and the at least one second electrode;
 at least one first piezo layer provided between the at least one first electrode and the at least one third electrode; and
 at least one second piezo layer provided between the at least one second electrode and the at least one third electrode;
 wherein the acoustic impedance transformation circuit is further configured to transform the input impedance between the third electrode and the second electrode into the output impedance higher than the input impedance between the at least one first electrode and the second electrode of the acoustic structure.

16. The apparatus of claim 15 wherein the output impedance equals at least sixteen times the input impedance.

17. The apparatus of claim 13 wherein the acoustic impedance transformation circuit further comprises at least one second acoustic structure comprising:

at least one first electrode coupled to the first electrode;

at least one second electrode coupled to the second electrode;

at least one third electrode provided between the at least one first electrode and the at least one second electrode and coupled to the third electrode;

at least one first piezo layer provided between the at least one first electrode and the at least one third electrode; and at least one second piezo layer provided between the at least one second electrode and the at least one third electrode.

18. The apparatus of claim 9 wherein:

the filter circuit comprises at least one series acoustic resonator coupled between an input node and the output node and configured to:

resonate in a series resonance frequency to pass a signal from the input node to the output node; and cause an electrical capacitance in a parallel resonance frequency different from the series resonance frequency; and the acoustic impedance transformation circuit further comprises:

a fourth electrode coupled to the input node; and a third piezo layer provided between the second electrode and the fourth electrode.

19. The apparatus of claim 18 wherein the acoustic impedance transformation circuit further comprises:

a first acoustic resonator comprising the first electrode, the first piezo layer, and the third electrode;

a second acoustic resonator comprising the third electrode, the second piezo layer, and the second electrode; and a third acoustic resonator comprising the second electrode, the third piezo layer, and the fourth electrode.

20. The apparatus of claim 19 wherein:

the second electrode is coupled to the ground via a tunable reactive circuit; and the third acoustic resonator is configured to cause a negative capacitance between the input node and the output node to cancel the electrical capacitance in the parallel resonance frequency.

* * * * *

UNITED STATES PATENT AND TRADEMARK OFFICE
CERTIFICATE OF CORRECTION

PATENT NO.       : 10,666,225 B2                                   Page 1 of 1
APPLICATION NO.  : 16/387940
DATED            : May 26, 2020
INVENTOR(S)      : Nadim Khlat It is certified that error appears in the above-identified patent and that said Letters Patent is hereby corrected as shown below:

In the Specification

In Column 6, Line 25, replace "(e.g., 1000)" with -- (e.g., 100 Ω) --.

Signed and Sealed this
Thirtieth Day of June, 2020

Andrei Iancu
*Director of the United States Patent and Trademark Office*